(12) United States Patent
Youker et al.

(10) Patent No.: US 6,862,191 B1
(45) Date of Patent: Mar. 1, 2005

(54) VOLUMETRICALLY EFFICIENT ELECTRONIC CIRCUIT MODULE

(75) Inventors: Nick Youker, River Falls, MN (US); Ronald L. Anderson, Herbster, WI (US); John E. Hansen, Coon Rapids, MN (US); Melburn Kjear, Woodbury, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 0 days.

(21) Appl. No.: 10/643,332

(22) Filed: Aug. 19, 2003

(51) Int. Cl.$^7$ .............................. H05K 7/10; H05K 7/12
(52) U.S. Cl. ...................... 361/768; 361/764; 174/52.2
(58) Field of Search ................................ 361/760–768, 361/749, 803; 174/52.2, 254, 260–263; 257/778–780, 787–790; 438/123, 106

(56) References Cited

U.S. PATENT DOCUMENTS

| | | | | |
|---|---|---|---|---|
| 5,224,023 A | * | 6/1993 | Smith et al. ................ | 361/784 |
| 5,448,511 A | * | 9/1995 | Paurus et al. ................ | 365/52 |
| 6,699,730 B2 | * | 3/2004 | Kim et al. ................ | 438/107 |
| 6,753,616 B2 | * | 6/2004 | Coyle ........................ | 257/787 |

* cited by examiner

*Primary Examiner*—Kamand Cuneo
*Assistant Examiner*—Tuan Dinh
(74) *Attorney, Agent, or Firm*—Thomas J. Nikolai; Nikolai & Mersereau, P.A.

(57) ABSTRACT

A miniaturized microelectronic, hybrid circuit package having either a single or a multi-layer, flexible, printed circuit substrate with printed conductors interconnecting a plurality of integrated circuit (IC) dies with a ball grid array (BGA) of contacts. The IC dies are arranged on parallel strips defined between preferential fold zones formed in the substrate. The dies are over molded with plastic that is shaped to facilitate the substrate being folded to form a polyhedron. When so folded, the over molded IC dies face inward and BGA is exposed on an outwardly facing surface to facilitate attachment of the folded package to a motherboard.

14 Claims, 6 Drawing Sheets

VOLUMETRICALLY EFFICIENT ELECTRONIC CIRCUIT MODULE

BACKGROUND OF THE INVENTION

I. Field of the Invention

This invention relates generally to packaging of electronic components, and more particularly to a way of effecting overall volumetric efficiency resulting in significant size reduction while still maintaining the requirement for electrically conductive pathways for active components.

II. Discussion of the Prior Art

In the field of implantable medical devices, such as automatic implantable cardiac defibrillators, cardiac pacemakers, neural stimulators and the like, there has been an on-going effort to reduce the physical size of the implantable devices while continuing to increase the functional capabilities of such devices.

Referring to FIG. 1, prior art packaging arrangements used in such devices typically have hybrid circuits whose sizes, surface areas, and volumes are defined by the X-axis and Y-axis area consumed by the necessary electrical components that are populated in a planar format lying parallel to the main hybrid motherboard assembly. Typically, the Z-axis utilization is neglected, being determined strictly by the thickest (tallest) electrical component on the assembly. Thus, a need exists for a packaging arrangement that more effectively utilizes hybrid area and volume parameters to achieve an overall device size reduction.

SUMMARY OF THE INVENTION

The present invention offers a unique, three-dimensional substrate packaging design that utilizes multiple planes, including but not limited to, the XY plane, the YZ plane and the XZ plane as surfaces on which electronic components, both active and passive, can be mounted to thereby significantly reduce the total hybrid surface area and total hybrid volume required for a given hybrid assembly.

A reduced volume electronic circuit module that is adapted for attachment to a motherboard comprises a multilayer, flexible, laminated, printed circuit substrate having single or multiple conductive layers. A plurality of integrated circuit dies are mounted on the first outer layer of the substrate in spaced-apart rows and the dies in each of the rows are over molded with plastic, leaving a space between adjacent rows which function as preferential fold zones. Disposed on the intermediate layer and exposed through a window formed through the second outer layer on a surface defined between two of the preferential fold lines is a plurality of terminal interconnect points, commonly referred to as a "ball grid array" or BGA. Printed wiring conductors on the intermediate layer connect selective ones of the plurality of terminal interconnect points in the grid pattern to the integrated circuit dies and to test pads that are removed from the substrate following testing of the assembly. A further feature of the invention is that the plastic over molding is geometrically shaped to permit and assist in the folding of the printed circuit substrate along the preferential fold zones such that the second outer layer is exposed and is in surrounding relation to the rows of over molded integrated circuit dies. The folded module may then be bonded to a motherboard, via the BGA. When the substrate is appropriately folded, it forms a polyhedron with the over molded components wrapped within the substrate with only the BGA on the second outer layer exposed.

DESCRIPTION OF THE DRAWINGS

The foregoing features, objects, and advantages of the invention will become apparent to those skilled in the art from the following detailed description of a preferred embodiment, especially when considered in conjunction with the accompanying drawings in which like numerals in the several views refer to corresponding parts.

DESCRIPTION OF THE PREFERRED EMBODIMENT

Figure 1:
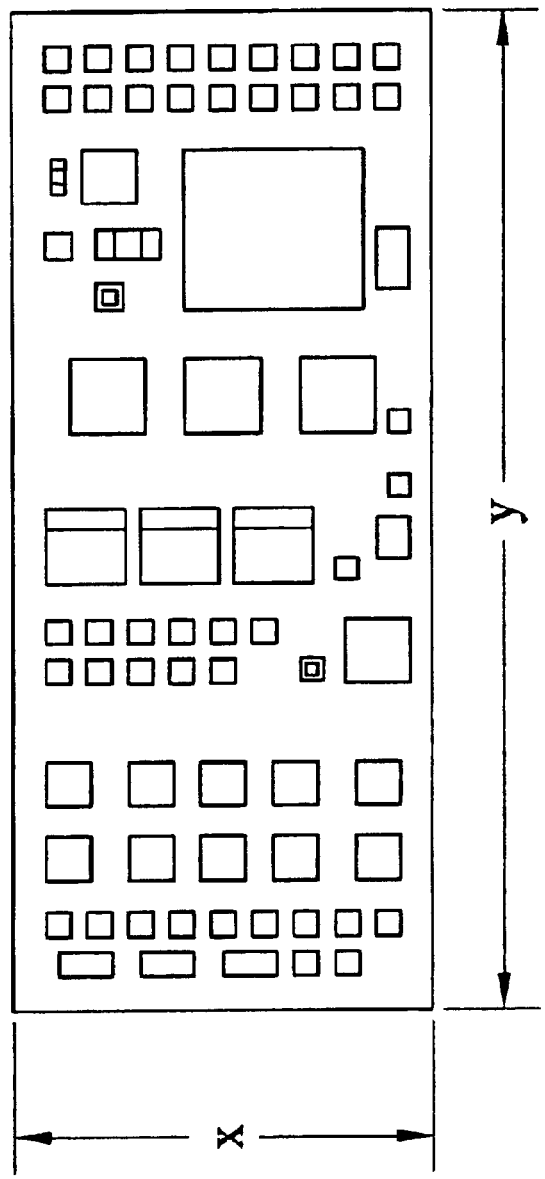
FIG. 1 is a top plan view of a typical prior art hybrid array.
Figure 2:
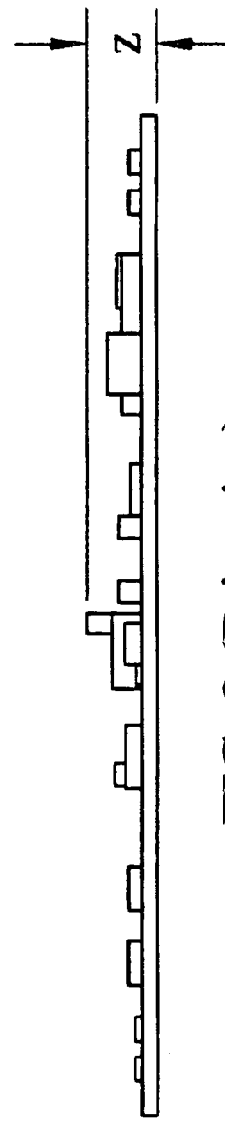
FIG. 2 is a side elevation thereof.
Figure 3:
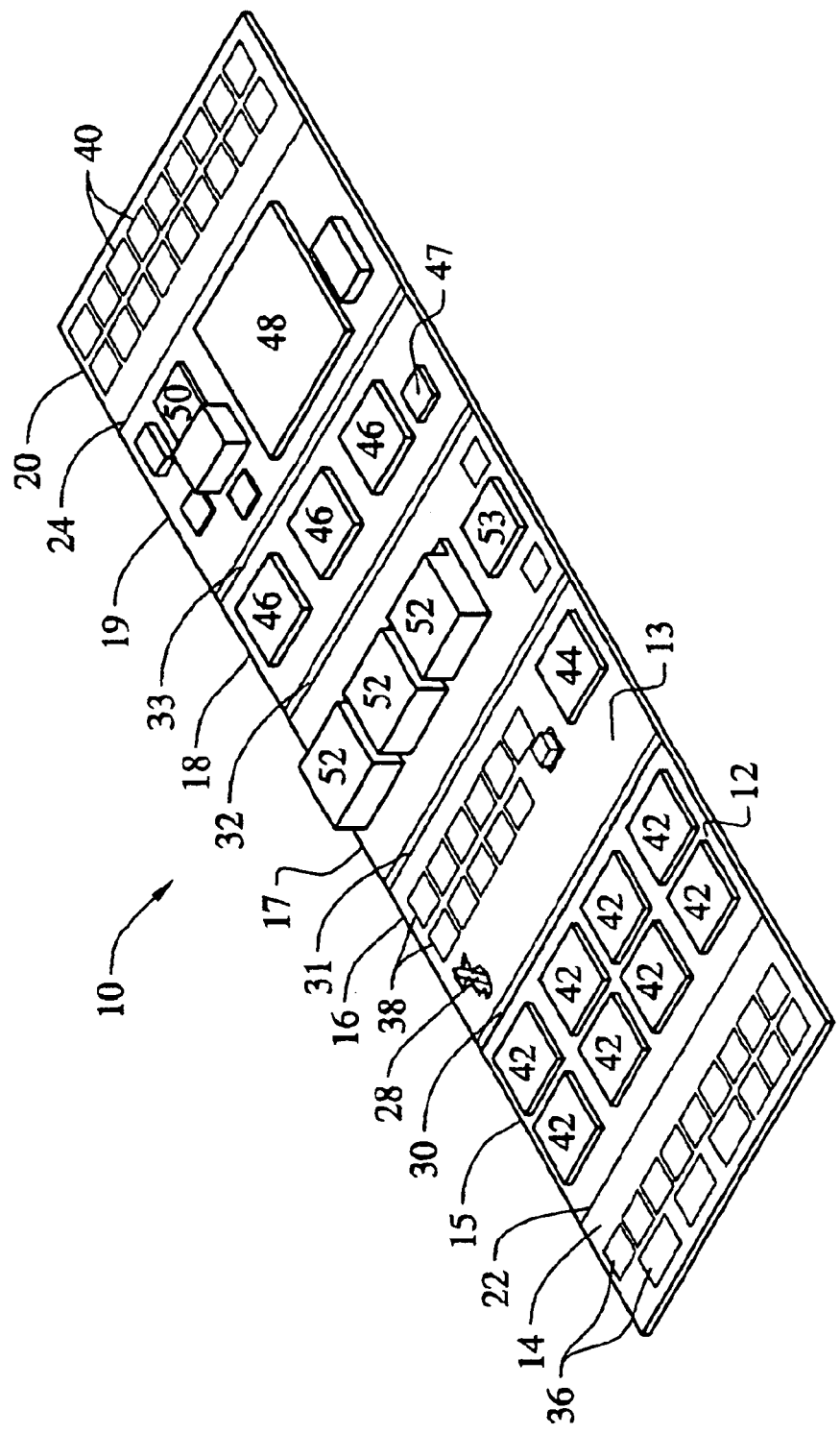
FIG. 3 is a top perspective view of a laminated printed circuit substrate having active and passive components mounted thereon prior to their being over molded.

Referring to FIG. 3 there is indicated generally by numeral 10 an electronic circuit module of the present invention at an early stage of manufacture in which a plurality of integrated circuit dies are bonded to a multilayer printed circuit substrate 12 at its upper major surface 13. The printed circuit substrate is partitioned into a plurality of rectangular strips 14–20 by cut lines 22 and 24 formed through a lower multiple surface 26 (FIG. 4) and by preferential fold zones 30–33. The lower major surface 26 supports a copper ground plane coextensive with strips 15, 16, 18 and 19. The substrate may also include an intermediate layer 28.

Figure 4:
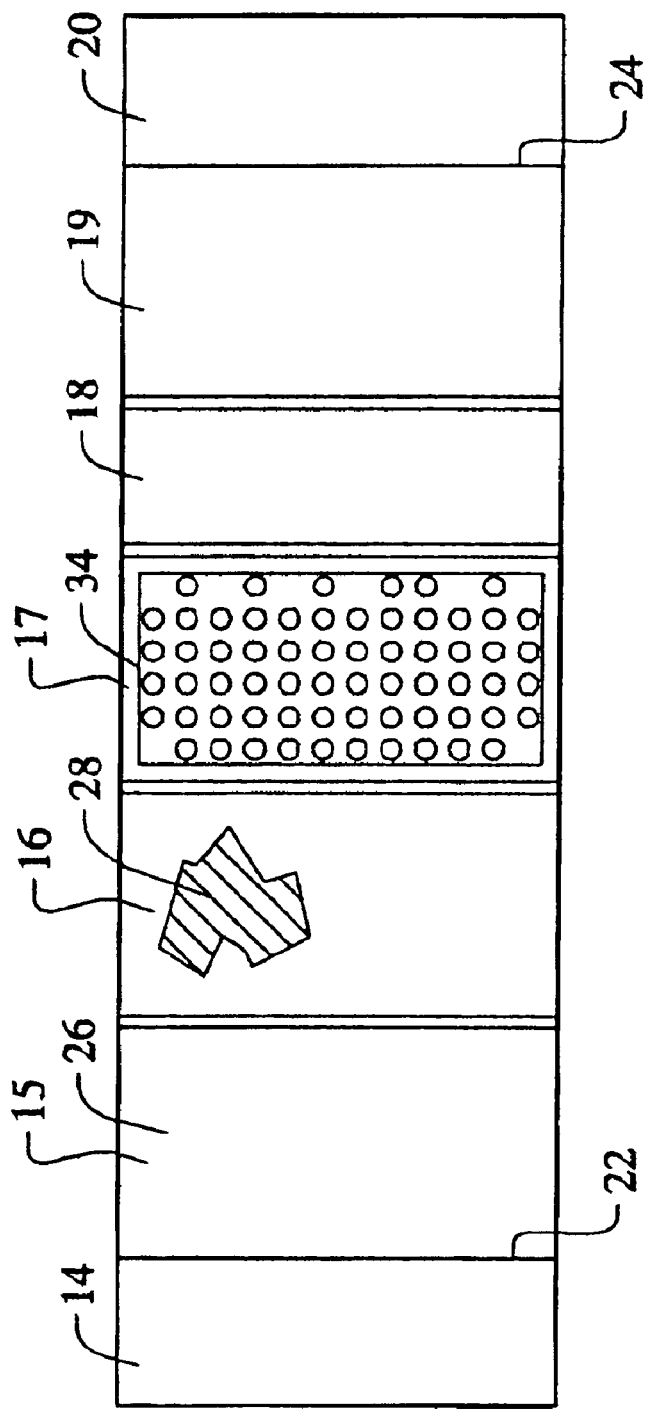
FIG. 4 is a bottom plan view of the printed circuit assembly of FIG. 3.

As can be seen in FIG. 4, a BGA comprising a plurality of terminal interconnect points is formed on either the lower major surface 26 or on the intermediate layer 28 of rectangular strip 17 and if on the intermediate layer, is exposed through a window 34 formed through the lower major surface 26. Individual ones of the terminal points of the BGA are connected by printed wiring (not shown) on either the intermediate layer 28 or one of the major surfaces to electrically connect the terminal points in the BGA to the integrated circuit dies and to test points, as at 36, 38 and 40, located on the upper major surface 12 in the rectangular strips 14 and 20 at opposed ends of the substrate 12 and in the rectangular strip 16 of FIG. 3.

With continued reference to FIG. 3, the IC circuit dies 42, 44, 46, 48, 50 and other components are located in the rectangular strips 15, 16, 18 and 19 and are appropriately bonded using conventional techniques known in the art. For example, thermal compression bonding on a gang basis may be used to create a diffusion bond between printed circuit leads and gold bumped bond pads on the individual ICs. Multichip modules, as at 52, are also electrically and mechanically bonded to the substrate as in the rectangular strip 17.

Figure 5:
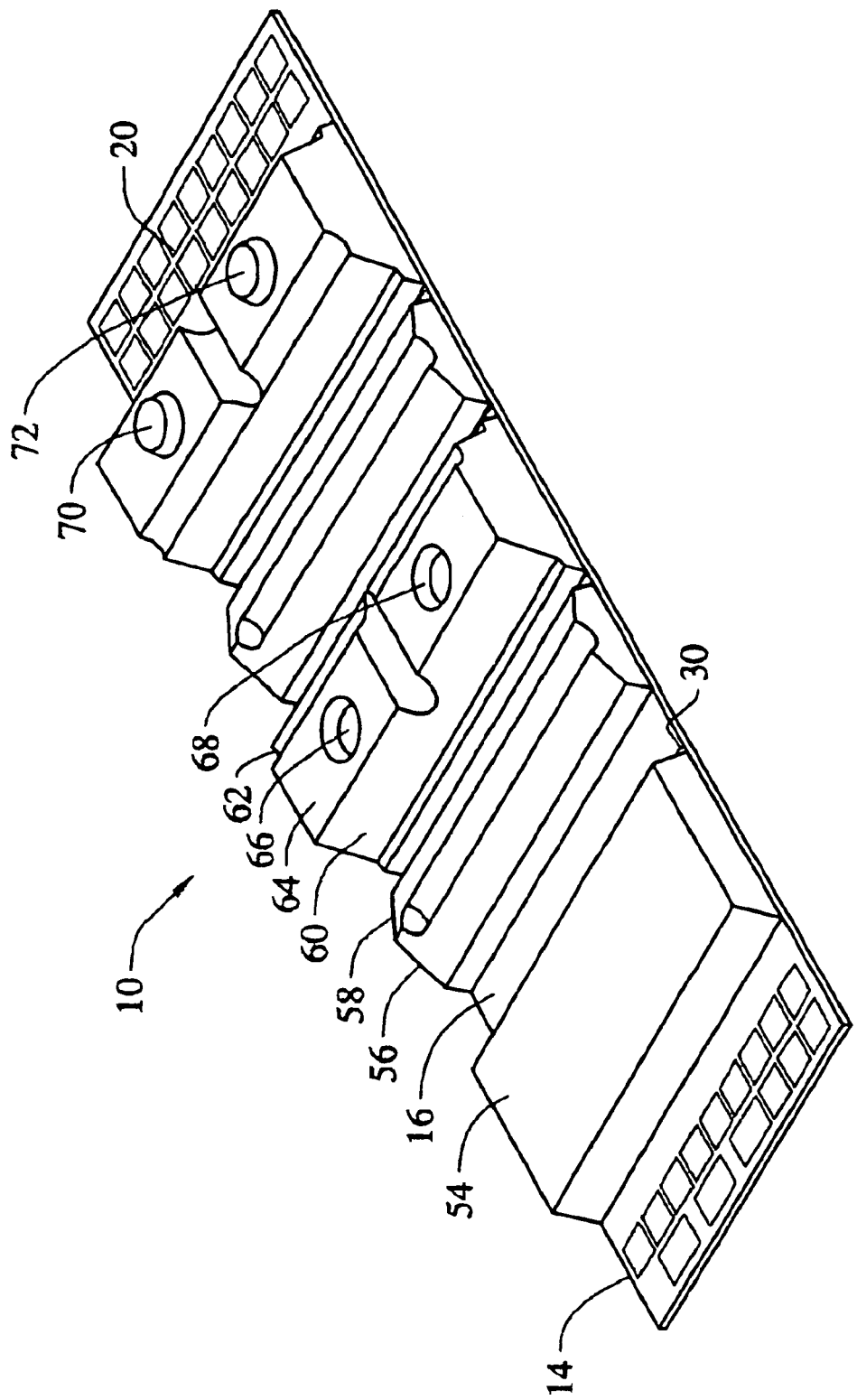
FIG. 5 shows the circuit subassembly after the integrated circuit dies and other components are over molded with plastic.

Once the IC dies are bonded in place on the substrate, they are over molded with a suitable plastic. FIG. 5 shows that all of the IC dies 42 occupying rectangular strip 15 in FIG. 3 are all encapsulated in a single rectangular block of plastic 54.

The plastic over molding 54 is dimensioned such that it does not encroach upon the cut line 22 or a fold zone 30 (FIG. 3) allowed for between rectangular strips 15 and 16.

The over molding of the test points 38 and the die in rectangular strip 16 is shaped so as to exhibit beveled side edges 56 and 58 (FIG. 5). Likewise, the dies 52 and 53 on rectangular strip 17 are over molded with plastic so as to exhibit beveled side edges 60 and 62 and a somewhat flat upper surface 64. The flat surface 64 includes inwardly directed dimples, as at 66 and 68, for reasons which will become apparent as the description of the highly volumetrically efficient electronic circuit module 10 of the present invention continues.

The shape of the plastic over molding in the rectangular strip 18 covering the IC dies 46 and 47 is similar in shape to that used in forming the over molding used in rectangular strip 17, except that instead of having recess dimples 66 and 68, the otherwise flat top of the over molding in rectangular strip 19 has outwardly extending protrusions, as at 70 and 72.

During electrical testing of the circuit subassembly 10, connections are made between the test pads 36 and 40 on the rectangular strips 14 and 20 (FIG. 3) and the test instrumentation employed. Following such testing, and presuming that the test criteria have been met, the substrate 12 is severed along the cut lines 22 and 24 to thereby remove the test pads, further decreasing the hybrid surface area consumption and effective physical size of the module. Following this operation, the remaining circuit module is folded in the preferential fold zones 30, 31, 32 and 33 to yield the configuration shown in the perspective view of FIG. 6 where the over molding members nest with one another to form a six-sided polyhedron. The BGA resides on the exposed lower surface of the rectangular strip 17, providing a convenient way for the circuit module of FIG. 6 to be solder bonded to a motherboard.

While the preferred embodiment depicted in the drawings results in a six-sided polyhedron when the substrate is folded in the manner described, it is envisioned that a polyhedron of more or less than six sides can be realized. This is achieved by providing additional strips and fold zones and by over molding so that the side edges are beveled at an angle greater or less than 45°.

When the printed circuit substrate shown in FIG. 5 is folded, the male protrusions 70 and 72 on the over molded ICs on rectangular strip 19 (FIG. 3) become registered with the female recessions 66 and 68 of the over molded ICs in the rectangular strip 17, not unlike the way LEGO® blocks are interconnected. A suitable bonding agent may be used to prevent the module from becoming unfolded.

Figure 6:
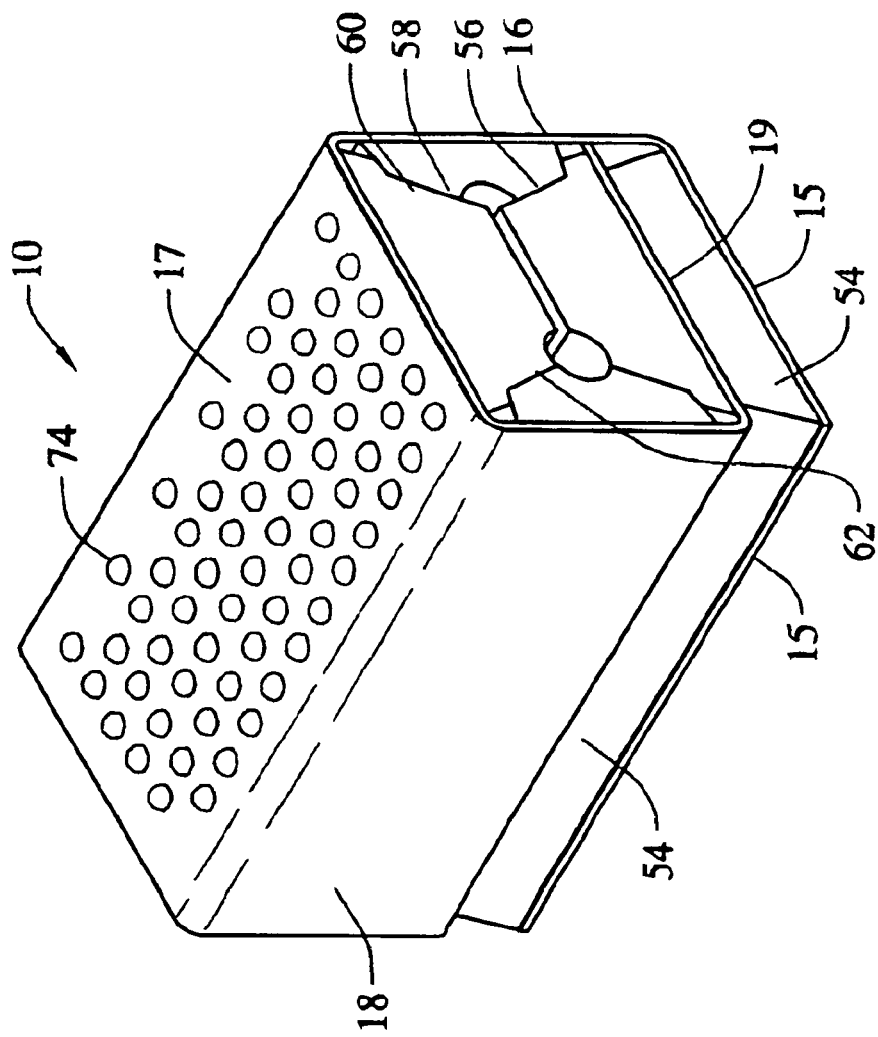
FIG. 6 is a perspective view of the electronics module after the folding thereof.
Figure 7:
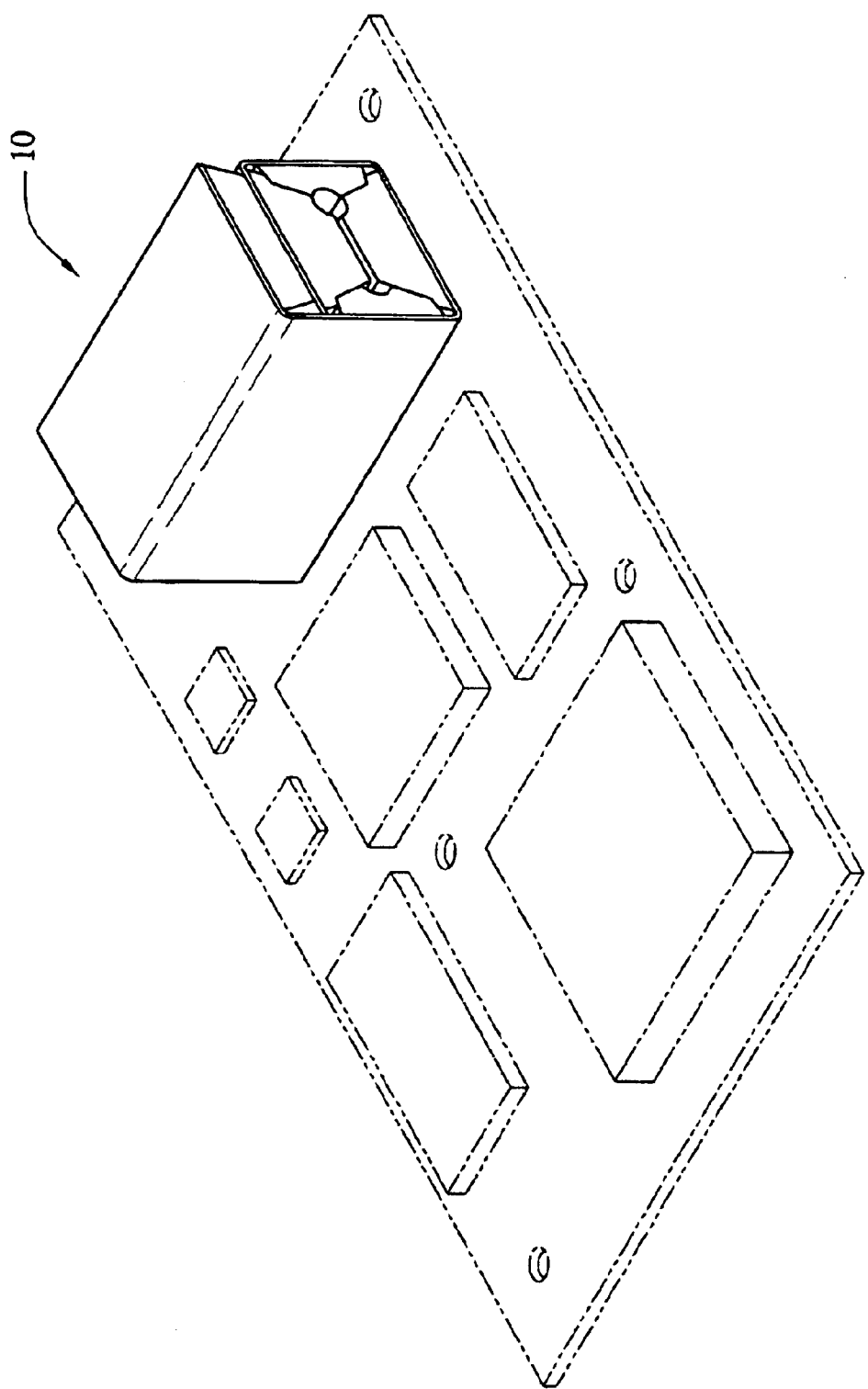
FIG. 7 is a perspective view showing the module of FIG. 6 affixed to a motherboard along with other circuit components.

It is apparent from observing the folded module illustrated in FIG. 6 that full advantage is taken of the XZ, YZ and XY planes as locations where active and passive electrical components may be placed to thereby increase the circuit component density while reducing the total hybrid area and volume required for the hybrid assembly. Solder balls, as at 74 (FIG. 6), are seen on the lower major surface 26 and are used to connect the module 10 to the motherboard as seen in FIG. 7. The copper ground planes that are supported on the lower outer surface effectively surround the encapsulated ICs and other components when the module is folded, thereby shielding the components from noise.

This invention has been described herein in considerable detail in order to comply with the patent statutes and to provide those skilled in the art with the information needed to apply the novel principles and to construct and use such specialized components as are required. However, it is to be understood that the invention can be carried out by specifically different equipment and devices, and that various modifications, both as to the equipment and operating procedures, can be accomplished without departing from the scope of the invention itself

What is claimed is:

1. A volumetrically efficient electronic circuit module adapted for attachment to a motherboard, said module comprising:
    (a) a flexible, laminated, printed circuit substrate having first and second major surfaces;
    (b) a plurality of integrated circuit dies mounted on the first major surface in spaced-apart rows, the dies in each row being overmolded with plastic leaving a space between adjacent rows;
    (c) a BGA disposed on the second major surface defined between two of said spaces;
    (d) printed wiring conductors on one of said first and second major surfaces connecting selected ones of a plurality of terminal points in the BGA to said integrated circuit dies; and
    (e) said plastic overmolding being shaped along opposed side edges to permit folding of the printed circuit substrate along the spaces between adjacent rows such that only the second major surface is exposed and is in surrounding relation to the rows of overmolded integrated circuit dies.

2. The volumetrically efficient electronic circuit module as in claim 1 wherein the spaces between adjacent rows comprise preferential fold zones.

3. The volumetrically efficient electronic circuit module as in claim 1 and further including a mother board having a plurality of contacts arranged in a grid pattern corresponding to that of the BGA on the second major surface of the printed circuit substrate; and
    a plurality of solder balls joining the plurality of contacts individually to the BGA.

4. The volumetrically efficient electronic circuit module as in claim 2 wherein folding the printed circuit substrate along said preferential fold zones converts the electronic circuit module to a polyhedron.

5. The volumetrically efficient electronic circuit module as in claim 4 wherein the polyhedron is a rectangular parallelepiped.

6. The volumetrically efficient electronic circuit module as in claim 4 wherein the second major surface incorporates a conductive ground plane on a flexible insulating sheet, said conductive ground plane surrounding the plurality of integrated circuit dies when the printed circuit substrate is folded along the preferential fold zones.

7. The volumetrically efficient electronic circuit module as in claim 4 wherein the over molded plastic covering the dies in a first row include a protuberance and the over molded plastic covering the dies in a second row include a recess for receiving the protuberance when the printed circuit substrate is folded to form the rectangular parallelepiped.

8. A volumetrically efficient electronic circuit module adapted for attachment to a motherboard, said module comprising:
    (a) a multi-layer, flexible, laminated, printed circuit substrate having first and second outer layers and at least one intermediate layer;
    (b) a plurality of integrated circuit dies mounted on the first outer layer in spaced-apart rows, the dies in each row being overmolded with plastic leaving a space between adjacent rows;

(c) a plurality of terminal points disposed in a grid pattern on the intermediate layer on a surface defined between two of said spaces and exposed through a window formed in the second outer layer;

(d) printed wiring conductors on the intermediate layer connecting selected ones of the plurality of terminal points in the grid pattern to said integrated circuit dies, (e) said plastic overmolding being shaped along opposed side edges to permit folding of the printed circuit substrate along the spaces between adjacent rows such that only the second outer layer is exposed and is in surrounding relation to the rows of overmolded integrated circuit dies.

9. The volumetrically efficient electronic circuit module as in claim 8 wherein the spaces between adjacent rows comprise preferential fold zones.

10. The volumetrically efficient electronic circuit module as in claim 8 and further including a mother board having a plurality of contacts arranged in a grid pattern corresponding to that of the plurality of terminal points on the second outer layer of the printed circuit substrate; and a plurality of solder balls joining the plurality of contacts individually to the plurality of terminal points.

11. The volumetrically efficient electronic circuit module as in claim 9 wherein folding the printed circuit substrate along said preferential fold zones converts the electronic circuit module to a polyhedron.

12. The volumetrically efficient electronic circuit module as in claim 11 wherein the polyhedron is a rectangular parallelepiped.

13. The volumetrically efficient electronic circuit module as in claim 11 wherein the second outer layer incorporates a conductive ground plane on a flexible insulating sheet, said conductive ground plane surrounding the plurality of integrated circuit dies when the printed circuit substrate is folded along the preferential fold zones.

14. The volumetrically efficient electronic circuit module as in claim 11 wherein the over molded plastic covering the dies in a first row include a protuberance and the over molded plastic covering the dies in a second row include a recess for receiving the protuberance when the printed circuit substrate is folded to form the rectangular parallelepiped.

* * * * *

UNITED STATES PATENT AND TRADEMARK OFFICE
CERTIFICATE OF CORRECTION

PATENT NO. : 6,862,191 B1
DATED : March 1, 2005
INVENTOR(S) : Nick Youker et al.

It is certified that error appears in the above-identified patent and that said Letters Patent is hereby corrected as shown below:

<u>Title page,</u>
Item [75], Inventors, the first inventor should be listed as:
-- Nick Youker, River Falls, WI (US) --.

Signed and Sealed this

Thirty-first Day of May, 2005

JON W. DUDAS
*Director of the United States Patent and Trademark Office*